United States Patent [19]
DesJardins et al.

[11] Patent Number: 6,026,420
[45] Date of Patent: Feb. 15, 2000

[54] HIGH-SPEED EVALUATION OF POLYNOMIALS

[75] Inventors: Philip A. DesJardins, Nevada City; Ravi G. Mantri, Grass Valley, both of Calif.

[73] Assignee: 3Com Corporation, Santa Clara, Calif.

[21] Appl. No.: 09/009,393

[22] Filed: Jan. 20, 1998

[51] Int. Cl.[7] .................................................. G06F 7/00
[52] U.S. Cl. ......................................................... 708/492
[58] Field of Search ........................... 708/492; 714/752, 714/781, 784, 785

[56] References Cited

U.S. PATENT DOCUMENTS

| | | |
|---|---|---|
| 5,130,990 | 7/1992 | Hsu et al. . |
| 5,323,402 | 6/1994 | Vaccaro et al. .......................... 714/785 |
| 5,642,367 | 6/1997 | Kao . |
| 5,712,861 | 1/1998 | Inoue et al. . |
| 5,715,262 | 2/1998 | Gupta ....................................... 714/785 |
| 5,771,244 | 6/1998 | Reed et al. ............................... 714/781 |
| 5,822,337 | 10/1998 | Zook et al. . |

OTHER PUBLICATIONS

Overill, R.E. et al., Data Parallel Evaluation of Univariate Polynomials by the Knuth–Eve Algorithm, Parallel Computing, vol. 23, No. 13, pp. 2115–2127 (Dec. 1997).

*Primary Examiner*—Tan V. Mai
*Attorney, Agent, or Firm*—McDonnell Boehnen Hulbert & Berghoff

[57] ABSTRACT

A method and device for evaluating polynomial equations with a logic computer. To evaluate the polynomial equation more efficiently using a computer with latent memory accesses, the polynomial is split into a plurality of sub-polynomials. The sub-polynomials can be simultaneously evaluated using Horner's rule. The results of the sub-polynomial evaluations are summed to obtain the evaluation of the polynomial equation. A device and method are described.

22 Claims, 4 Drawing Sheets

HIGH-SPEED EVALUATION OF POLYNOMIALS

BACKGROUND OF THE INVENTION

A. Field of the Invention

The present invention relates to a method and device for evaluating polynomials. In particular, the present invention relates to a method and device for speeding the evaluation of Galois field polynomials.

B. Description of the Related Art

Digital data transmission systems are used in a variety of different applications ranging from transferring financial numbers representing dollar amounts in bank accounts, to storing the music of our favorite performers on compact digital audio discs, to communicating telemetry data with aircraft and orbiting space satellites. To transmit this type of information, digital transmission systems deliver a sequence of binary information to a receiver across a transmission channel. Due to impairments in the transmission channel (i.e., the inability of the transmission channel to accurately deliver the transmitted bits), the binary information may become corrupted or changed as they traverse the transmission channel. If the errors remain undetected, the amounts in our bank accounts would be wrong, our favorite singers would be out of tune, and aircraft could be lost.

To prevent these problems, error detection schemes are employed to detect differences between the originally transmitted bits and the received data bits. When a transmission error is detected, the error detection scheme signals the transmitter to resend the corrupted information. More advanced error detection schemes, known as Forward-Error-Correction ("FEC"), can detect and correct corrupted information without requiring the transmitter re-send the information. FEC codes are essential in systems where the re-sending of information is not possible or practical. For example, in a compact audio disc there is not sufficient time to re-send the digital audio information without affecting the sound quality; with deep space probes re-sending the information may take a great deal of time.

A Galois finite field is a defined number system composed of a finite number of elements. A Galois finite field of q elements is usually denoted as GF(q). The q number of elements in a Galios field are of the form $p^M$, where p is a prime integer and M is a positive integer.

Galois fields are particularly useful in FEC codes, such as Reed Solomon codes, for detecting and correcting errors in a transmitted sequence of binary information bits. For example, a sequence of binary information bits is first partitioned into a sequence of symbols, where each symbol is M-bits long. Each symbol is an element of a $2^M$ element Galois field, denoted as $GF(2^M)$. The symbols are further partitioned into groups of K number of symbols represented by $d_{K-1}, d_{K-2}, d_{K-3}, \ldots d_2, d_1, d_0$, where $d_{K-1}$ is first in the sequence (transmitted first in time) and $d_0$ last in the sequence (transmitted last). The sequence of transmitted symbols can thus be represented as an $(K-1)^{th}$ order polynomial:

$$D(X)=d_{K-1}X^{K-1}+d_{K-2}X^{K-2}+ \ldots +d_2X^2+d_1X+d_0$$

where X is a symbol delay operator and the $d_i$'s are the coefficients of a Galois Field polynomial.

To implement a FEC using Galois field polynomials, redundant symbols are appended to the message stream. The resultant message is N symbols long and is called a codeword of the FEC. The methods for determining these redundant symbols are well known to those skilled in the art of error correction and described in "Error Control Coding: An Introduction," by Peter Sweeney, Prentice Hall 1991 and "Theory and Practice of Error Control Codes," by Richard E. Blahut, Addison-Wesley Publishing Company, Inc., 1983, which are hereby incorporated by reference. The transmitter transmits the modified message, which is received at the receiver, but is possibly corrupted. The receiver implements the FEC by treating the received symbols as coefficients of a Galois field polynomial. The polynomial is evaluated for certain input values where the evaluated results form a set called a syndrome, which holds the keys for locating errors in the message stream. The specifics of locating and correcting errors are well known to those skilled in the art and described in the above texts.

Calculating syndromes with Galois field polynomials may appear difficult, however, there are ways of simplifying polynomial equations so that the calculations can be more easily performed. One method of simplifying polynomial calculations, known as Horner's rule, states that a polynomial equation $C(X)=c_{N-1}X^{N-1}+c_{N-2}X^{N-2}+ \ldots +c_2X^2+c_1X+c_0$ can be evaluated for a value of $X=X_i$ through a recursion which requires only addition and a sequential multiplication by the same value of $X_i$. The polynomial C(X) can be factored or broken down into:

$$C(X_i)=( \ldots ((c_{N-1}X_i+c_{N-2})X_i+c_{N-3})X_i+ \ldots +c_1)X_i+c_0$$

As seen from the above recursive formula, the only multiplication required by the polynomial is multiplication by $X_i$. In the recursive formula, $c_{N-1}$ is multiplied by $X_i$ and $c_{N-2}$ is added. The result of the addition is multiplied by $X_i$ again, and $c_{N-3}$ is added. This operation simply repeats (N-1) times with each iteration having two steps: (1) the outcome of the previous step is multiplied by $X_i$ and (2) $c_k$ is added to the result. It will be appreciated by those skilled in the art that the addition and multiplication used to evaluate these polynomials do not follow the rules of ordinary addition and multiplication, but are Galois Field addition and multiplication.

Because evaluation of the polynomial equation requires only the multiplication by $X_i$, a multiplication table $L_i$ can be created for a value of $X_i$ and stored by a programmable computer in memory. The multiplication lookup table $L_i$ is $2^M$ elements long and contains the product of the input (index j) with $X_i$:

$$L_i(j)=j*X_i.$$

In practice, for a small value of i, that is a small number of $X_i$'s to evaluate the polynomial, a set of i multiplication tables are created and stored in computer memory. The polynomial evaluation process can then perform multiplication by indexing and retrieving the result in the proper lookup table stored in computer memory.

Horner's rule is highly sequential because each step is dependent on the outcome of the previous step, i.e., each iteration depends on the result of the previous iteration. Thus the polynomial equation must be evaluated serially, awaiting the outcome of the previous calculation. Accordingly, the rate at which the polynomial can be evaluated by a programmable computer is thus limited because each iteration must be evaluated in serial fashion. In computer processors having a long latency in performing memory accesses, this method of evaluating polynomials is inefficient. For example, a digital signal processor performs the multiplication by accessing the multiplication lookup table stored in memory. To return the result of a multiplication from memory, however, the processor may require a number of memory clock cycles. Meanwhile, the processor sits idle awaiting the result of the multiplication look-up table because each iteration of the polynomial calculation depends on the result of the previous iteration.

SUMMARY OF THE INVENTION

The present invention addresses the problem of evaluating polynomial equations used in error correcting codes for detecting and correcting errors in transmitted data. In accordance with the present invention, the evaluation of polynomial equations using a logic computer with memory can be accelerated by splitting the polynomial equation into a plurality of sub-polynomial equations. The plurality of sub-polynomial equations can be simultaneously evaluated by the computer processor in parallel and summed together to obtain the result of the polynomial evaluation. Overlapping the evaluation of the sub-polynomial equations allows the computer processor to utilize the latency time in retrieving results from the multiplication table look-up operation to evaluate other sub-polynomial equations, thus speeding the evaluation of the polynomial.

In an exemplary embodiment, a splitter splits the polynomial equation into a plurality of sub-polynomial equations. The plurality of sub-polynomial equations can be evaluated simultaneously using adders, accumulators, multipliers, final multipliers, a summer and control logic. The components can be implemented using computer software, electrical circuitry or hardware using combinational logic. For example, the adders may be implemented by an Arithmetic Logic Unit ("ALU") central processing unit or by using exclusive-OR logic gates. The multipliers are preferably implemented as multiplication look-up tables stored in computer memory. Control logic coordinates the addressing and sequencing of the adders, multipliers and summers to implement Horner's rule to simultaneously evaluate the sub-polynomials. Horner's rule can be simultaneously carried out on the sub-polynomials to overlap the memory latency during the memory access of the multiplication lookup table. The summer then sums the results of the sub-polynomial evaluations to form the result of the polynomial evaluation.

The described method splits a polynomial equation representing a sequence of transmitted data into a plurality of smaller sub-polynomials. Rather than serially evaluating the entire polynomial equation, each of the sub-polynomials can be evaluated in parallel using Horner's rule. Overlapping the sub-polynomial additions with the memory access operations can thus minimize the effects of memory latency during the multiplication table look-up operation. For example, while the computer processor is performing a multiplication operation requiring a wait for results from memory, it may switch to evaluating a second sub-polynomial until it must initiate a memory access for that second sub-polynomial. Depending on the degree of latency in retrieving multiplication results from memory, a plurality of sub-polynomials may be simultaneously evaluated to speed the evaluation of the polynomial.

BRIEF DESCRIPTION OF THE DRAWINGS

The foregoing and other objects, features and advantages of the present invention will be more readily appreciated upon reference to the following disclosure when considered in conjunction with the accompanying drawings, in which.

DETAILED DESCRIPTION OF THE PREFERRED EMBODIMENT

Figure 1:
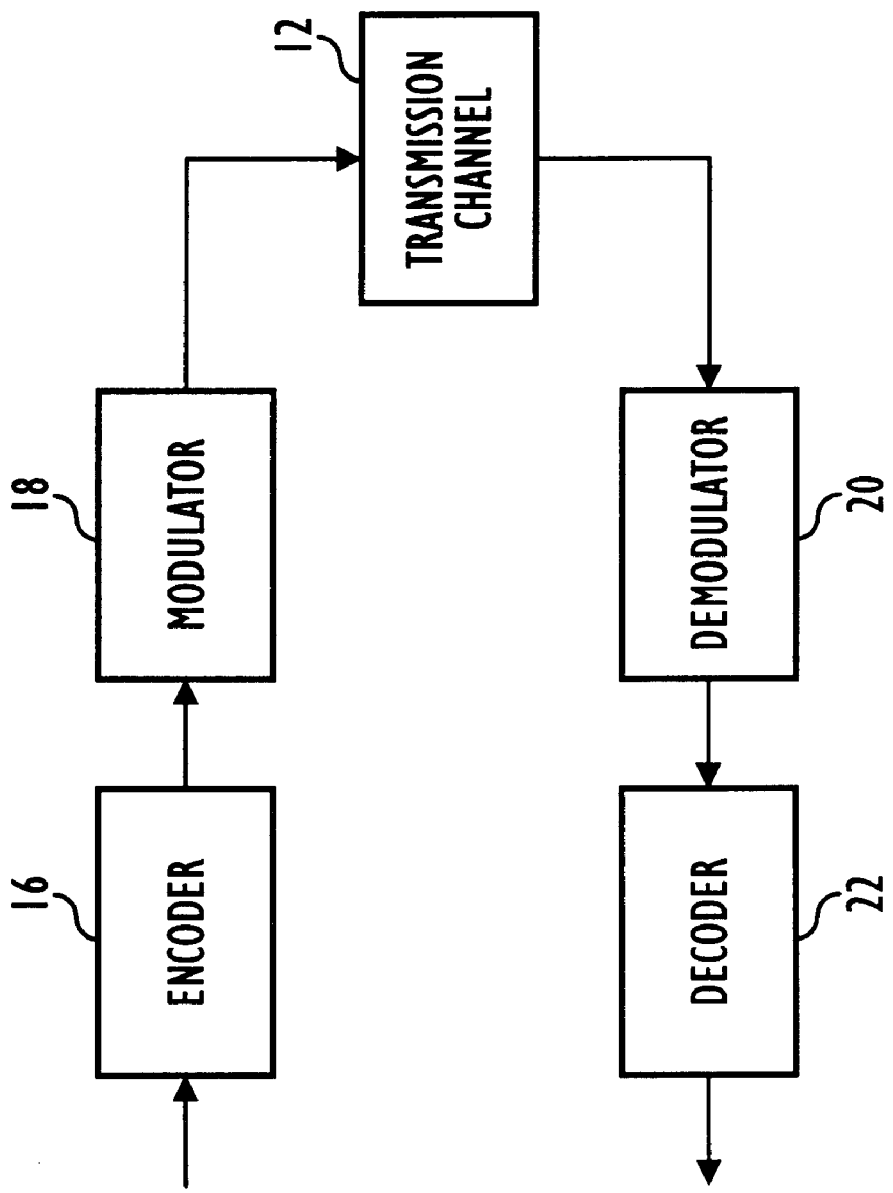
FIG. 1 shows a data transmission system for transmitting digital data in accordance with an aspect of the present invention.

FIG. 1 shows an exemplary data transmission system 10 for transmitting digital data in accordance with the present invention. The transmission channel 12 may not have a frequency bandwidth sufficient to directly convey digital information signals, so the digital data is modulated by a modulator 18 to a format that can be conveyed by the transmission channel 12. Various modulation techniques such as pulse amplitude modulation, phase modulation, quadrature amplitude modulation may be utilized with the present embodiment.

The transmission channel 12 introduces a number of unwanted effects, such as attenuation, distortion, interference and noise to the data that corrupts the transmitted information. Because the channel 12 introduces errors corrupting the transmitted data, the data are encoded 16 to provide error detection and correction. The encoder 16 may involve a number of stages and incorporate interleaving and other coding techniques known to those skilled in the art. The present invention focuses on improving error coding/decoding techniques to combat the distortion and corruption of digital data caused by the transmission channel. It will be apparent to those of skill in the art that the techniques and devices described herein may be used in conjunction with other forms of encoding.

In the preferred embodiment, digital data are presented to the encoder 16 in frames consisting of a fixed number of symbols. Each symbol input to the encoder 16 simply represents a bit or a M number of bits. Encoder 16 preferably appends a number of symbols to the digital data to create a codeword enabling error control and correction. Thus, the output of the encoder 16 generally contains more symbols than the input, meaning redundancy has been added to the data. At the receiver, the demodulator 20 and decoder 22 perform complementary operations to the modulator 18 and the encoder 16 to restore the originally transmitted digital data.

Figure 2:
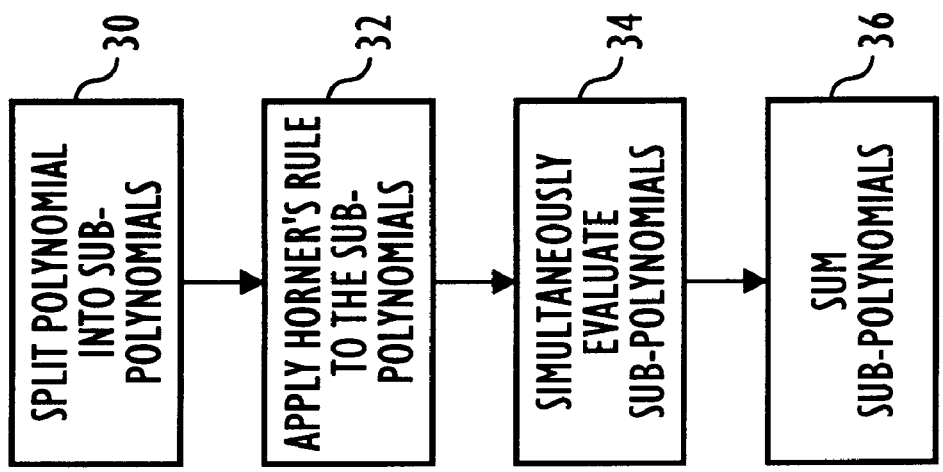
FIG. 2 shows a flow chart embodying an illustrative method in accordance with the principles of the invention used in the system of FIG. 1.

FIG. 2 shows a flow chart of a method used by a decoder 22 for speeding the evaluation of polynomials used to determine if errors occurred during data transmission.

At step 30, the polynomial C(X) corresponding to the received symbols is split into a number of sub-polynomials. In this exemplary embodiment, the polynomial C(X) can be split into two sub-polynomial equations: a first sub-polynomial equation with the even-order terms and a second sub-polynomial with the odd-order terms.

$$C(X)=C_{EVEN}(X)+X*C_{ODD}(X),$$

where $C_{EVEN}(X)=c_0+c_2X^2+c_4X^4+\ldots$ $C_{ODD}(X)=c_1+c_3X^2+c_5X^4+\ldots$ At step 32, Horner's rule is applied to each sub-polynomial equation to overlap or simultaneously evaluate the sub-polynomial equations. As previously discussed, Horner's rule, states that a polynomial $C(X)=c_{N-1}X^{N-1}+c_{N-2}X^{N-2}+\ldots+c_2X^2+c_1X+c_0$ can be evaluated for a value of $X=X_i$ through a recursion which requires only a sequential multiplication by $X_i$. The polynomial $C(X)$ can be factored down to:

$$C(X_i)=(\ldots((c_{N-1}X_i+c_{N-2})X_i+c_{N-3})X_i+\ldots+c_1)X_ic_0$$

As seen from the above recursive formula, the only multiplication required by the polynomial is multiplication by $X_i$. In the recursive formula, $c_{N-1}$ is multiplied by $X_i$ and $c_{N-2}$ is added. The result of the addition is multiplied by $X_i$ again, and $C_{N-3}$ is added. This operation simply repeats N–1 times.

When Horner's rule is applied to the even-order sub-polynomial terms for instance:

$$C_{EVEN}(X_i^2)=(\ldots((( C_{MAXEVEN}X_i^2+C_{MAXEVEN-2})X_i^2+\ldots)X_i^2+c_4)X_i^2+c_2)X_i^2c_0$$

In this case, the iterative multiplier is $X_i^2$ rather than $X_i$. $C_{MAXEVEN}$ is the coefficient corresponding to the highest even power of the polynomial $C(X)$. Horner's rule is also applied to the odd-order terms:

$$C_{ODD}(X_i^2)=(\ldots((( C_{MAXODD}X_i^2+C_{MAXODD-2})X_i^2+\ldots)X_i^2+c_5)X_i^2+c_3)X_i^2+c_1$$

At step 34, the $C_{EVEN}(X_i^2)$ and $C_{ODD}(X_i^2)$ sub-polynomials are simultaneously evaluated with the addition to one sub-polynomial proceeding while the other sub-polynomial evaluation awaits a memory access. Evaluating the sub-polynomial with the odd-order terms is only slightly more complicated than the sub-polynomial with the even-order terms $C_{EVEN}(X)$. The sub-polynomial evaluation of the odd-order terms $C_{ODD}(X)$ may be initiated by multiplying the highest odd-order term coefficient by $X_i$, or multiplying the final result by $X_i$. Because this final multiplication is performed only once during the sub-polynomial evaluation, it may be performed using more general purpose hardware or software without unduly increasing the overall evaluation time.

At step 36, the result of the evaluation of the two sub-polynomials can then be summed together to obtain the result of the evaluation of the polynomial equation.

The technique of splitting a polynomial into a plurality of sub-polynomials with separate even and odd terms can be generalized into splitting the polynomial into a greater number of sub-polynomials to provide more parallelism. For example, the polynomial may be divided into three sub-polynomials and evaluated using the iterative multiplier $X_i^3$, or into four sub-polynomials using the iterative multiplier $X_i^4$, and so forth. Generally, the polynomial equation can be split into K sub-polynomial equations where the coefficients of the sub-polynomials come from each $K^{th}$ coefficient of the original polynomial.

$$C(X) = c_0 + c_K X^K + c_{2K} X^{2K} + c_{3K} X^{3K} \ldots +$$
$$c_1 X + c_{K+1} X^{K+1} + c_{2K+1} X^{2K+1} + c_{3K+1} X^{3K+1} \ldots +$$
$$c_2 X^2 + c_{K+2} X^{K+2} + c_{2K+2} X^{2K+2} + c_{3K+2} X^{3K+2} \ldots +$$
$$c_{K-1} X^{K-1} + c_{2K-1} X^{2K-1} + c_{3K-1} X^{3K-1} + c_{4K-1} X^{4K-1} \ldots$$

The optimal amount of partitioning K depends on the cycle time of the loop performing the new-coefficient addition and the multiplication lookup, which is based on the latency of the processor memory access. A greater level of partitioning is desirable when using processors with a longer memory access latency. Partitioning of sub-polynomials should stop when each cycle in a loop evaluating the polynomials are performing an addition of a sub-polynomial.

Figure 3:
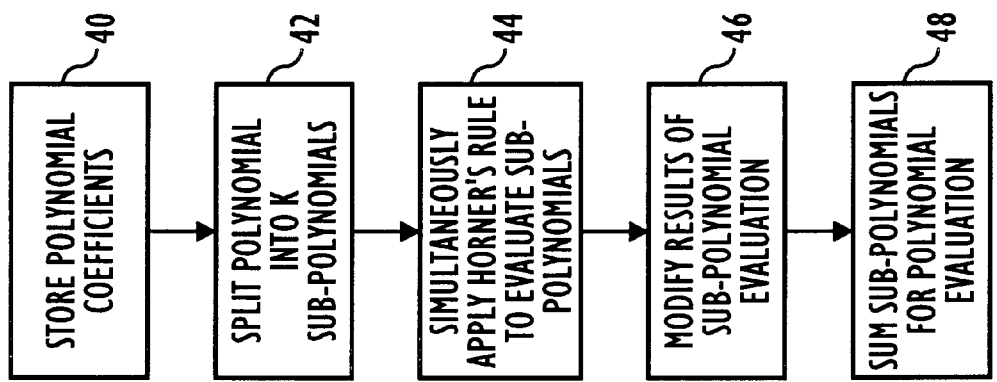
FIG. 3 shows a flow chart of an exemplary general method in accordance with the principles of the invention used in the system of FIG. 1.

Referring now to FIG. 3, a flow chart of a generalized method for speeding the evaluation of a polynomial equation divided into K sub-polynomial equations is shown.

At step 40, the coefficients $C_i$ of the polynomial $C(X)$ having N number of coefficients representing the transmitted codeword are stored in an array of memory locations C[i] (for i=0 to N–1) in computer memory. A central processing unit with a data bus and addressable random access memory may perform this function or combinational logic, shift registers or buffers may also be used.

At step 42, the polynomial is split into a plurality of K sub-polynomial equations. The coefficients of polynomial $C(X)$ are separated into the coefficients of K sub-polynomials $C_m(X_i^K)$ for m=0 to K–1 by having K indices into the array of coefficients of C[i]. Each index is separated by 1 and is incremented by K. Without loss of generality we may assume that N is a multiple of K which implies that the sub-polynomials $C_m(X_i^K)$ are of degree L=(N/K–1). If N is not a multiple of K, then the C(k)s for k>=N are set to 0 in the array C[K].

The result for each sub-polynomial is initialized to the coefficient of the highest degree term in that sub-polynomial:

Result[m]=C[LK+m], for all m=0 to K–1.

At step 44, Horner's rule is applied to evaluate each sub-polynomial. The evaluation of the sub-polynomial equations are overlapped, meaning that the evaluation of one sub-polynomial is initiated and continues until it initiates a latent memory access of the multiplication look-up table. Rather than awaiting the outcome of the memory access, which may take several clock cycles to complete, the evaluation of a second sub-polynomial equation is continued. The second sub-polynomial equation can be evaluated until it also requires a latent memory access. In practice, K is appropriately set to carry out the appropriate degree of sub-polynomial evaluation overlap according to the processor latency in accessing memory. After the $K^{th}$ sub-polynomial memory access has been initiated, the processor switches back to adding terms to the first sub-polynomial.

As will be appreciated by those of skill in the art, latency in memory access can be compensated by partitioning and overlapping the evaluation of sub-polynomials. The greater the memory latency, the more partitioning can be made.

Horner's rule is applied L times to each sub-polynomial equation. The sub-polynomial evaluation operation is:

Result[m]=Result[m]*$X_i^K$+C[(L–j)K+m]

for m=0 to K–1, where j is the iteration variable though the loop, j=1 to L. Of course, the "*" operator is Galois Field multiplication and "+" is Galois Field addition.

At step 46, after the loop for the sub-polynomial equations are performed, each result Result[m] is modified by multiplication by $X_i^m$ for all m=0 to K–1. Because this multiplication is performed only once per evaluation, it can be implemented with more general purpose hardware. At step 48, when all sub-polynomial evaluations have been completed, the K modified Result[m]*$X_i^m$ results are summed together to form the final result of the polynomial evaluation.

The described method can be implemented in software as demonstrated by the following pseudo code excerpt:

/* Without loss of generality, let's assume N is a multiple of K. If N is not a multiple of K, higher-order zero coefficient terms are appended to C(X) so that N becomes a multiple of K */

L=(N/K)−1;
/* Initiate Horner's rule */
for (m=0; m<K; m++)
    Result[m]=C[L*K+m];
/* Loop through applying Horner's Rule */
/* Result[m]=Result[m]*$X_i^K$+C[(L−j)K+m] */
for (j=1; j<=L; j++)
    for (m=0; m<K; m++)
        Result[m]=GfSum(GfMultiByXiToTheK(Result[m]),C[(L−j)K+m]);
/* Modify Results */
for (m=0; m<K; m++)
    Result[m]=GfMult(Result[m], XiToThe[m]);
/* Sum Results Together to Get Polynomial Result */
FinalResult=Result[0];
for (m=1; m<K; m++)
    FinalResult=GfSum(Result[m], FinalResult);

In the above pseudo code the array, XiToThe[m] contains the value of $X_i^m$ and the function GfMultiByXiToTheK is preferably optimized to multiply the input by $X_i^K$, preferably using a lookup table. Although described as a function, the code may preferably be implemented as inline code.

While the present embodiment has been described as a method, it can readily be implemented as hardware in the form of a custom gate array or an application specific integrated circuit ("ASIC"). A variety of software, firmware, and hardware can be used to implement the embodiments described herein. For example, the described methods may be implemented in a high-level C or C++ programming language by those of skill in the art. The software may be compiled, stored, and executed in either firmware or a disk-based operating system. In a representative embodiment, the described software is implemented in assembly language to run on a digital signal processor. Of course, a microcontroller or a personal computer may also be suitable. The software may be stored and executed in either firmware or a disk-based computer operating system.

Figure 4:
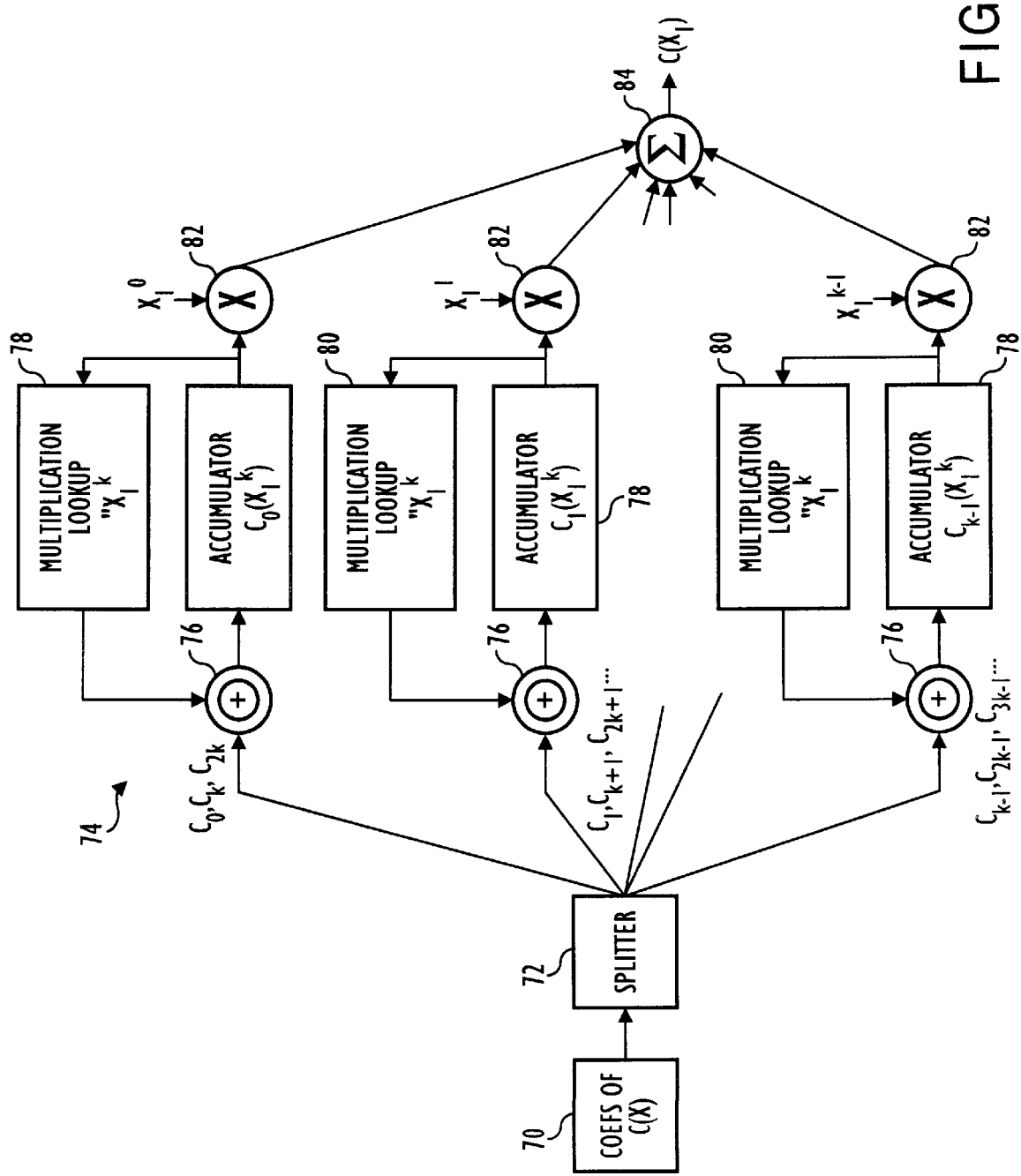
FIG. 4 shows a block diagram embodying an illustrative device in accordance with the present invention used in the system of FIG. 1.

Now referring to FIG. 4, illustrated is a hardware or firmware apparatus for speeding the evaluation of polynomial equations such as Galois field polynomials used in error correction schemes. This illustrative embodiment includes a coefficient splitter 72, a device for evaluating sub-polynomials 74, and a summer 84. As seen in FIG. 4, a plurality of device for evaluating sub-polynomials are depicted and used to provide overlapping, parallel evaluation of the sub-polynomial equations. The operation of the device is coordinated by control logic (not shown) implementing the polynomial evaluation methods described above. The control logic can be software, firmware or hardware programmed to implement the methods described in FIGS. 2 and 3.

To begin the polynomial evaluation, the polynomial coefficients 70 are split by the splitter 72 into a number of sub-polynomials and supplied to a device for evaluating the sub-polynomials 74. The splitter 72 can be embodied in software, firmware or hardware implementing the methods described herein. For example, the coefficients of the polynomial C(X) can be stored in an array of memory locations C[i] (for i=0 to N−1) in computer memory. The splitter 72 may also be implemented using electrical circuitry, combinational logic, shift registers, and buffers. The polynomial coefficients C[i] are split into K sub-polynomials $C_m(X_i^K)$, for m=0 to K−1, by having K indices to the array of coefficients C[i]. Each index is separated by 1 and is incremented by K. A means of delivering the sub-polynomial coefficients to the device for evaluating the sub-polynomials 74 is not explicitly shown but could be implemented as an addressing unit in a computer processing unit.

The device for evaluating the sub-polynomials 74 includes adders 76, accumulators 78, a multiplier 80, and a final multiplier 82 which can operate in parallel to simultaneously evaluate a number of sub-polynomials. The adders 76 implement the addition operation in Horner's rule by adding coefficient values $c_0$, $c_K$, $c_{2K}$, to the result of the multiplication products. The adders 76 receive the coefficient values $c_0$, $c_K$, $c_{2K}$ from the splitter 72 and the multiplication products $C_j(X_i^K)$ from the multiplier 80 and accumulator 78. Of course, the adders 76 implement polynomial addition in $GF(2^M)$, such as modulo-2 addition rather than ordinary addition. The result of the adders 76 are supplied to the accumulators 78 for the next iteration of multiplication and addition. The adders 76 can be implemented in software or in hardware by electrical circuitry, combinational logic, exclusive-or ("XOR") logic gates, shift registers and buffers.

The accumulators 78 maintain the current value of Result[m] during the evaluation of the sub-polynomials. For example, the accumulators 78 receive the result of the adders 76 and maintains the current value of Result[m] during the multiplier 80 memory access operation. The accumulators 78 may be embodied in computer software or by memory locations in random access memory, shift registers and buffers.

A multiplier 80 multiplies the current value of Result[m] by $X_i^K$ and is preferably implemented as a plurality of multiplication lookup tables $L_i$ containing products of $X_i^K$. The multiplication lookup tables $L_i$ are M bits wide and contain the results of multiplications over the Galois field $GF(2^M)$. Of course, the multiplication is the appropriate Galois Field multiplication. During the polynomial evaluation, the lookup table $L_i(n)$ is indexed by the current value of the accumulator to yield the product $X_i^K$*Accumulator value as required in the generalized Horner's rule. Preferably, the accumulators 78 share copies of the multiplication lookup table $L_i$ to save on the memory required to maintain multiple copies of the table $L_i$. A number of different multiplication lookup tables used for the differing values of $X_i$ can be maintained in a memory storage device such as disk drive and moved into random access memory as needed. The multiplier can also be implemented in hardware using combination logic, shift registers, buffers, etc.

Final multiplier 82 multiplies the final accumulator results by $X_i^m$ and the summer 84 sums the results together to yield the result of the polynomial evaluation $C(X_i)$. The final multiplier 82 and summer 84 operate only once per polynomial evaluation and can therefore be implemented using more general-purpose hardware or software. An arithmetic logic unit of a computer processor can be programmed to perform the multiplication operation. Dedicated hardware such as combinational logic can also be used to implement the multiplier 82 and summer 84.

To coordinate the operation of the device, control logic to control the addressing and sequencing of the addition and multiplication operations carrying out the polynomial evaluation using Horner's rule is implemented using software, firmware, or hardware. Software implementing the operations described in connection with FIGS. 2 and 3 can be implemented by those skilled in the art with the Figures and descriptions herein. Likewise, digital hardware design using electrical circuitry can be designed by using ASICs, custom gate arrays or programmable logic arrays to implement the desired functions.

The described methods and apparatus provide the ability to speed the evaluation of polynomials by splitting the polynomials into a number of sub-polynomials that can be simultaneously evaluated. The evaluation of the sub-polynomial can be performed such that the latency time during the multiplication table accesses are utilized to evaluate other sub-polynomials. In this fashion, a number of sub-polynomials can be simultaneously evaluated to more quickly obtain the result of the polynomial evaluation. In implementations where access to the multiplication lookup tables require multiple clock cycles to complete but can be initiated every clock cycle, the described embodiments can yield considerable improvements in speed.

It is to be understood that both the foregoing general description and the following detailed description are exemplary and explanatory and are intended to provide further explanation of the invention as claimed. Numerous modifications and variations are possible. It is intended that the foregoing detailed description be regarded as illustrative rather than limiting. It is the following claims, including all equivalents, which are intended to define the scope of this invention.

We claim:

1. A device for evaluating a polynomial equation comprising:
   a splitter for splitting the polynomial into a plurality of sub-polynomial equations;
   a plurality of accumulators for evaluating the sub-polynomial equations of the polynomial equation;
   a plurality of adders in communication with the corresponding plurality of accumulators, wherein the adders add to the sub-polynomial equations in the plurality of accumulators;
   a plurality of multipliers in communication with the corresponding plurality of accumulators and the corresponding plurality of adders;
   control logic to control the adders and multipliers to carry out Horner's rule on the sub-polynomials;
   a plurality of final multipliers in communication with the corresponding plurality of accumulators for multiplying accumulator values; and
   a summer in communication with the plurality of final multipliers for summing final multiplier values to yield a result of the polynomial evaluation.

2. The device of claim 1 wherein the plurality of accumulators for evaluating the sub-polynomial equations simultaneously evaluate a plurality of sub-polynomial equations.

3. The device of claim 1 wherein the polynomial comprises a Galois field polynomial.

4. The device of claim 1 wherein the plurality of multipliers comprise a multiplication look-up table stored in memory.

5. The device of claim 1 wherein the plurality of multipliers comprise shift registers.

6. The device of claim 1 wherein the plurality of adders comprise Exclusive-OR logic.

7. The device of claim 1 wherein the control logic comprises programmed software.

8. The device of claim 1 wherein the control logic comprises digital logic hardware.

9. The device of claim 1 wherein the plurality of accumulators comprise locations in computer memory.

10. The device of claim 1 wherein the plurality of accumulators comprise computer processor registers.

11. The device of claim 1 wherein the sub-polynomial equations comprise a first sub-polynomial equation comprising the even-order terms and a second sub-polynomial equation comprising the odd-order terms.

12. The device of claim 4 wherein the sub-polynomial equations comprise a plurality of sub-polynomial equations appropriate for the number of the clock cycles required to access the multiplication table.

13. A computer readable medium having stored therein instructions for causing a processing unit to execute a method of evaluating a polynomial equation comprising the steps of:
   splitting a polynomial equation into a plurality of sub-polynomial equations;
   evaluating the sub-polynomial equations by accessing the multiplication table stored in memory, wherein a number of the plurality of sub-polynomial equations are evaluated simultaneously; and
   summing the results of the step of evaluating sub-polynomials to obtain the evaluation of the polynomial.

14. The computer-readable medium of claim 13 wherein the polynomial is a Galois field polynomial.

15. The computer-readable medium of claim 13 wherein the step of evaluating the sub-polynomial uses Horner's rule.

16. The computer-readable medium of claim 13 wherein the step of evaluating the sub-polynomial requires a latent memory access.

17. A computer-readable medium having stored therein instructions for causing a processing unit to execute a method of evaluating a polynomial equation comprising the steps of:
   storing coefficients of the polynomial into memory locations;
   separating the coefficients into a plurality of sub-polynomials;
   evaluating the plurality of sub-polynomials using a multiplication lookup table stored in memory; and
   summing the result of the sub-polynomials evaluation to obtain the result of the polynomial evaluation.

18. The computer-readable medium of claim 17 wherein the step of evaluating the plurality of sub-polynomials evaluates a number of sub-polynomials simultaneously.

19. A device for evaluating a polynomial equation comprising:
   a splitter for splitting a polynomial equation into a plurality of sub-polynomial equations;
   a multiplier for simultaneously evaluating the sub-polynomial equations; and
   a summer for summing the evaluation results of the sub-polynomial equations to obtain the evaluation of the polynomial.

20. The device of claim 19 wherein the splitter and multiplier comprise electronic circuitry.

21. The device of claim 19 wherein the summer comprises combinational logic.

22. The device of claim 19 wherein the summer comprises a computer logic processor.

* * * * *